United States Patent [19]

Arimoto et al.

[11] Patent Number: 5,022,007
[45] Date of Patent: Jun. 4, 1991

[54] TEST SIGNAL GENERATOR FOR SEMICONDUCTOR INTEGRATED CIRCUIT MEMORY AND TESTING METHOD THEREOF

[75] Inventors: Kazutami Arimoto; Yoshio Matsuda; Tsukasa Ooishi; Masaki Tsukude; Kazuyasu Fujishima, all of Hyogo, Japan

[73] Assignee: Mitsubishi Denki Kabushiki Kaisha, Tokyo, Japan

[21] Appl. No.: 506,616

[22] Filed: Apr. 10, 1990

[30] Foreign Application Priority Data

Apr. 13, 1989 [JP] Japan .................................. 1-93716
Mar. 5, 1990 [JP] Japan .................................. 2-54002

[51] Int. Cl.$^5$ .......................................... G16C 29/00
[52] U.S. Cl. ............................... 365/201; 365/190; 371/10.1; 371/21.1
[58] Field of Search ............... 365/190, 201; 371/10.1, 371/21.1

[56] References Cited

U.S. PATENT DOCUMENTS 4,833,643  5/1989  Hori ................................. 365/190
4,856,002  8/1989  Sakashita et al. ............... 365/201
4,980,863  12/1990 Ogihara ........................... 365/190

OTHER PUBLICATIONS

Inoue et al., "Parallel Testing Technology VLSI Memories", International Test Conference (1987) pp. 1066–1071.

Ohsawa, et al., "Special Purpose Accelerators", IEEE International Solid-State Circuit Conference (1987), pp. 286–287.

Arimoto et al., "A 60ns 3.3V 16Mb DRAM", IEEE International Solid-State Conference (1989) pp. 244–245, 352.

Primary Examiner—Joseph Clawson, Jr.
Attorney, Agent, or Firm—Lowe, Price, Leblanc and Becker

[57] ABSTRACT

A test signal generator for a semiconductor integrated circuit memory, wherein when transfer transistors (20, 21, 14, 15) are rendered conductive, a test data cloumn is supplied from an I/O line pair (11, 12) to a column of a register (10) and stored therein. When a transfer (67) is rendered conductive, the test data column written in the register is written in a column of a memory cell (22) in the same pattern and when transfer transistors (16, 17) are rendered conductive, the test data column written in the register is inverted and the, written in the memory cell column, Data in the memory cell column is read out by a word line (13) and amplified by a sense amplifier (5), so that the data and the test data stored in the register are compared by a coincidence detection circuit 8 to detect whether it is coincident or not.

7 Claims, 11 Drawing Sheets

| 0 | 1 | 0 | 1 | 0 | 1 |
| 1 | 0 | 1 | 0 | 1 | 0 |
| 0 | 1 | 0 | 1 | 0 | 1 |
| 1 | 0 | 1 | 0 | 1 | 0 |
| 0 | 1 | 0 | 1 | 0 | 1 |
| 1 | 0 | 1 | 0 | 1 | 0 |

FIG.5

| 0 | 0 | 0 | 0 | 0 | 0 |
|---|---|---|---|---|---|
| 1 | 1 | 1 | 1 | 1 | 1 |
| 0 | 0 | 0 | 0 | 0 | 0 |
| 1 | 1 | 1 | 1 | 1 | 1 |
| 0 | 0 | 0 | 0 | 0 | 0 |
| 1 | 1 | 1 | 1 | 1 | 1 |

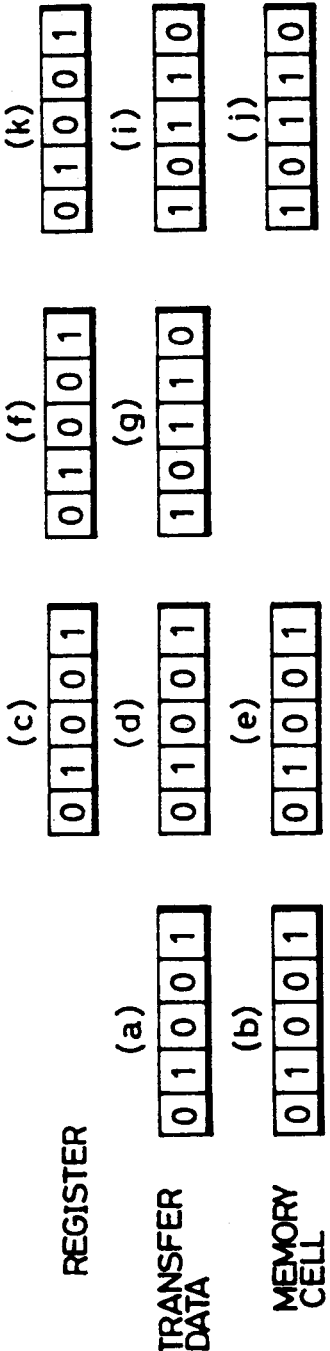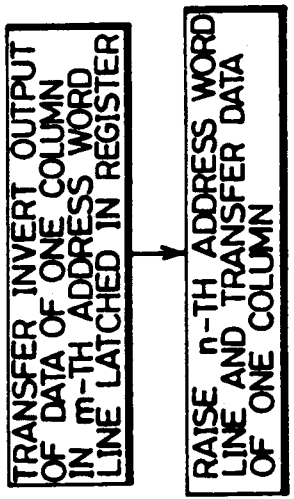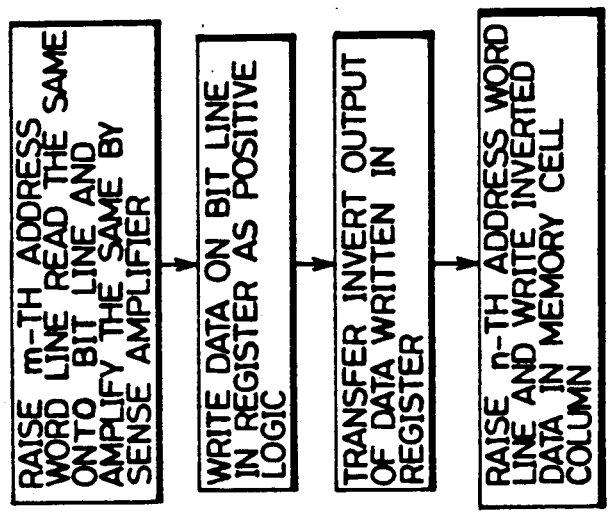

TEST SIGNAL GENERATOR FOR SEMICONDUCTOR INTEGRATED CIRCUIT MEMORY AND TESTING METHOD THEREOF

BACKGROUND OF THE INVENTION

1. Field of the Invention

The present invention relates generally to test signal generators for semiconductor integrated circuit memories and a testing method thereof. More particularly, the present invention relates to test signal generators for semiconductor integrated circuit memories such as dynamic RAMs self-containing line mode test circuits for reducing time for testing memory cells in large capacity memories and a testing method thereof.

2. Description of the Background Art

FIG. 13 is a block diagram showing an entire structure of a conventional dynamic RAM. Referring to FIG. 13, an address signal Ai is applied to an address buffer 31. The address buffer 31 stores the address signal Ai, applies a row address signal to row decoders 36a and 36b, applies a column address signal to a column decoder 40 and applies a part of the row address signal to a timing generator 32. The row decoder 36a designates a row address of a memory cell array 35a, the row decoder 36b designates a row address of a memory cell array 35b, and the column decoder 40 designates each column address of the memory cell arrays 35a and 35b. A RAS signal, an R/W signal and a TE signal are applied to the timing generator 32. The timing generator 32 applies a switching signal to sense amplifiers 37a and 37b for controlling switching of data writing to the memory cell array 35a or 35b, or of reading the written data from the array 35a or 35b in response to a signal of a part of the row address signal.

A line test controller 33 applies a test pattern signal to registers 39a and 39b for controlling a line test. Coincidence detection circuits 38a and 38b determine whether test patterns stored in the registers 39a and 39b, and data stored in each column of each memory cell in the memory cell arrays 35a and 35b are coincident or not, and when not coincident, it outputs an error flag through an I/O buffer 34.

FIG. 14 is a diagram showing a part of an array structure of a conventional dynamic RAM self-containing a line mode test circuit. The example shown in FIG. 14 is described in "ISSCC89 Digest of Technical Papers FAM16.4" by the present inventors. Referring to FIG. 14, paired bit lines 1 and 2 are connected to a sense amplifier 5 and memory cells 22 are connected at intersections of the bit line 1 and a word line 13. In addition, the sense amplifier 5 is connected to a coincidence detection circuit 8 comprising, for example, an EXOR circuit and to one end of nodes 3 and 4 through transfer transistors 6 and 7.

The coincidence detection circuit 8 and a register 10 are connected to the nodes 3 and 4. The register 10 comprises two inverters having inputs and outputs connected to each other provided for latching input. The coincidence direction circuit 8 is provided for detecting whether the expectation latched in the register 10 and the data stored in a memory cell 22 are coincident or not. A pair of main I/O lines 11 and 12 are connected to the other ends of the nodes 3 and 4 through transfer transistors 20 and 21. A coincidence line 9 for outputting a line test result is connected to the coincidence detection circuit 8. The transfer transistors 6 and 7 are controlled by a clock signal $\phi_3$ and the transfer transistors 20 and 21 are controlled by a column decoder output signal Yn.

FIG. 15 is a flow chart explaining an operation for performing a line test mode in a conventional dynamic RAM shown in FIG. 14, FIG. 16 is a diagram showing a memory cell array comprising a matrix of m rows x n columns, and FIG. 17 is a diagram showing one example of a test pattern for testing a line mode in a conventional dynamic RAM.

Now referring to FIGS. 13 to 17, a description will be given of an operation for testing a line mode in a conventional dynamic RAM. First, the column decoder output signal Yn is applied to the transfer transistors 20 and 21, so that the transfer transistors 20 and 21 are rendered conductive, thereby connecting the nodes 3 and 4 to the pair of main I/O lines 11 and 12. Then, a random test pattern column is inputted to be written in the register 10 through the pair of main I/O lines 11 and 12, the transfer transistors 20 and 21, and the nodes 3 and 4.

Then, the transfer transistors 6 and 7 are rendered conductive by the clock signal $\phi_3$ and the word line 13 is driven, whereby the data written in the register 10 is transferred to the bit line pairs, 1 and 2, through the transfer transistors 6 and 7 to be inputted to a column in the memory cell 22 designated by the selected word line 13. When the memory array is structured by a matrix of m rows x n columns as shown in FIG. 16, n bit data is transferred, at one time, to a column of the memory cell. By performing such transfer operation m times, that is, to all the word lines, data is written in the whole memory array.

Reading operation will be performed in the following. More specifically, data in a column of the memory cell 22 selected by the single word line 13 has a small potential difference, so that it is amplified by the sense amplifier 5 to be read out onto the bit line pair, 1 and 2. On the other hand, the column of the expectation data is kept in a column of the register 10. At this time, the transfer transistors 6 and 7 are closed. The coincidence detection circuit 8 detects whether the data read out from the memory cell 22 onto the bit line pair of 1 and 2, and the expectation latched in the register 10 are coincident with each other or not. The detected result of coincidence is outputted to the coincidence line 9. More specifically, the coincidence line 9 is precharged to a high level and an output of the coincidence detection circuit 9 is wired OR connected, so that when any of data in columns in the memory cell 22 and data in columns of the register 10 is incoincident, a level of the coincidence line 9 is discharged to a lower level and a flag indicating the coincidence is outputted. By performing the reading operation for detecting coincidence (Line-Read Operation) m times to all the word lines, reading comparison of the whole memory array is completed.

Representing a single operation cycle time as $t_c$, a test time necessary for performing a test will be represented as follows, $$t = n \cdot t_c + m \cdot t_c + m \cdot t_c = t_c(2m+n)$$

which is a total amount of register write time, copy write time and line read time. On the other hand, in a test, various test patterns are achieved in a large capacity DRAM in order to improve a detection sensitivity of interference between adjacent memory cells, and the like. Accordingly, a testing method is required in which a test pattern as random as possible can be implemented.

As described above, in a conventional dynamic RAM self-containing a line mode test circuit, although a test pattern can be random in a direction of the word line 13, a pattern in a direction of a bit line can only be the same. More specifically, as shown in FIG. 17, even though a random pattern can be produced in a column direction, only the same pattern can be produced in a row direction.

SUMMARY OF THE INVENTION

A main object of the present invention is to provide a test signal generator for a semiconductor integrated circuit memory capable of producing a random test pattern not only in a word line direction but also in a bit line direction and a testing method thereof.

Another object of the present invention is to provide a test signal generator for a semiconductor integrated circuit memory by which a line mode testing can be achieved which allows a random pattern in a bit line direction and in which a test time can be drastically reduced to markedly improve a sensitivity for detecting defect in a line mode test and a testing method thereof.

Briefly stated, the present invention is a test signal generator for a semiconductor integrated circuit memory having a plurality of bit line pairs, each pair including a first bit line and a second bit line, wherein first and second voltages respectively corresponding to first and second logic levels are outputted from a signal source, and the first and the second voltages are selected by first switching means and then supplied to the first and second bit lines, and also the outputted first and second voltages are selected and inverted by second switching means and then supplied to the first and second bit lines.

Accordingly, in accordance with the present invention, it is possible to write and read the date of the first and second voltages respectively corresponding to the first and the second logic levels or the data of the inversion of the first and second voltages, or the data of combination thereof, to achieve a line mode test which allows a random pattern also in the bit line direction. As a result, a test time can be drastically reduced, thereby significantly improving a sensitivity for detecting defect in a line mode test.

In a more preferred embodiment of the present invention, each bit line of a plurality of bit line pairs is divided into first and second nodes by a transfer gate and memory cells of a semiconductor integrated circuit memory are connected to the first and the second nodes. A signal source comprises a register for storing non-inverted and inverted logic level signals to the first nodes of the bit line pairs, and a first switching circuit is connected so as to supply the non-inverted and inverted logic level signals stored in the register to the respective first nodes of respective ones of the bit lines of the bit line pairs. A second switching circuit is connected so as to supply the non-inverted and inverted logic level signals to the respective first nodes of respective ones of the bit lines of the bit line pairs.

In a more preferred embodiment of the present invention, non-inverted and inverted logic level signals appearing on the first nodes of the bit line pairs and the logic level signals appearing on the second nodes of the bit line pair are compared by a comparing circuit. The second switching circuit is connected between the comparing circuit and first nodes corresponding to bit lines of any of the bit line pairs corresponding to the non-inverted or inverted logic level signal stored in a register.

In a more preferred embodiment of the present invention, a comparison output of the comparing circuit is temporarily stored by a temporary storing circuit and the temporarily stored comparison output is outputted to bit line pairs by a third switching circuit.

In accordance with another aspect, the present invention is a test signal generator for a semiconductor integrated circuit memory having a bit line pair, a sense amplifier connected to the bit line pair, a memory cell connected to the bit line pair and a test circuit for testing a function of the memory cell, wherein first and second voltages respectively corresponding to first and second logic levels are outputted from a signal source, so that the first and second voltages are selected by a first switching circuit and then supplied to first and second bit lines, and the outputted first and second voltages are selected and inverted by a second switching circuit and then, supplied to the first and second bit lines.

In accordance with a further aspect, the present invention is a testing method for testing a column of memory cells of a semiconductor integrated circuit memory by a test circuit contained therein, wherein, at least either non-inverted or inverted logic level signals of a plurality of bits corresponding to a column of the semiconductor integrated circuit memory are established by a first step. The established at least either the non-inverted or inverted logic level signals of the plurality of bits are temporarily stored in a second step and the temporarily stored logic level signals are read out in a third step. The read out logic level signals are inverted in a fourth step and the inverted logic level signals are transferred and stored in the memory cells in a fifth step. The stored logic level signals are read out in a sixth step and the read out logic level signals and the temporarily stored logic level signals in the second step are compared in a seventh step.

More preferably, the result of the comparison is stored in a eighth step.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a diagram showing one example of a test pattern in the embodiment shown in FIG. 4.

FIG. 9 is also a diagram showing a change of the data.

FIG. 10 is a flow chart for explaining an operation for inverting and storing data which is read from a memory cell column in a memory cell column corresponding to a different word line, with no data left in a register.

FIG. 11 is a flow chart for explaining an operation for storing the data in a memory cell column corresponding to a different word line, with the data left in a register.

DESCRIPTION OF THE PREFERRED EMBODIMENTS

Figure 1:
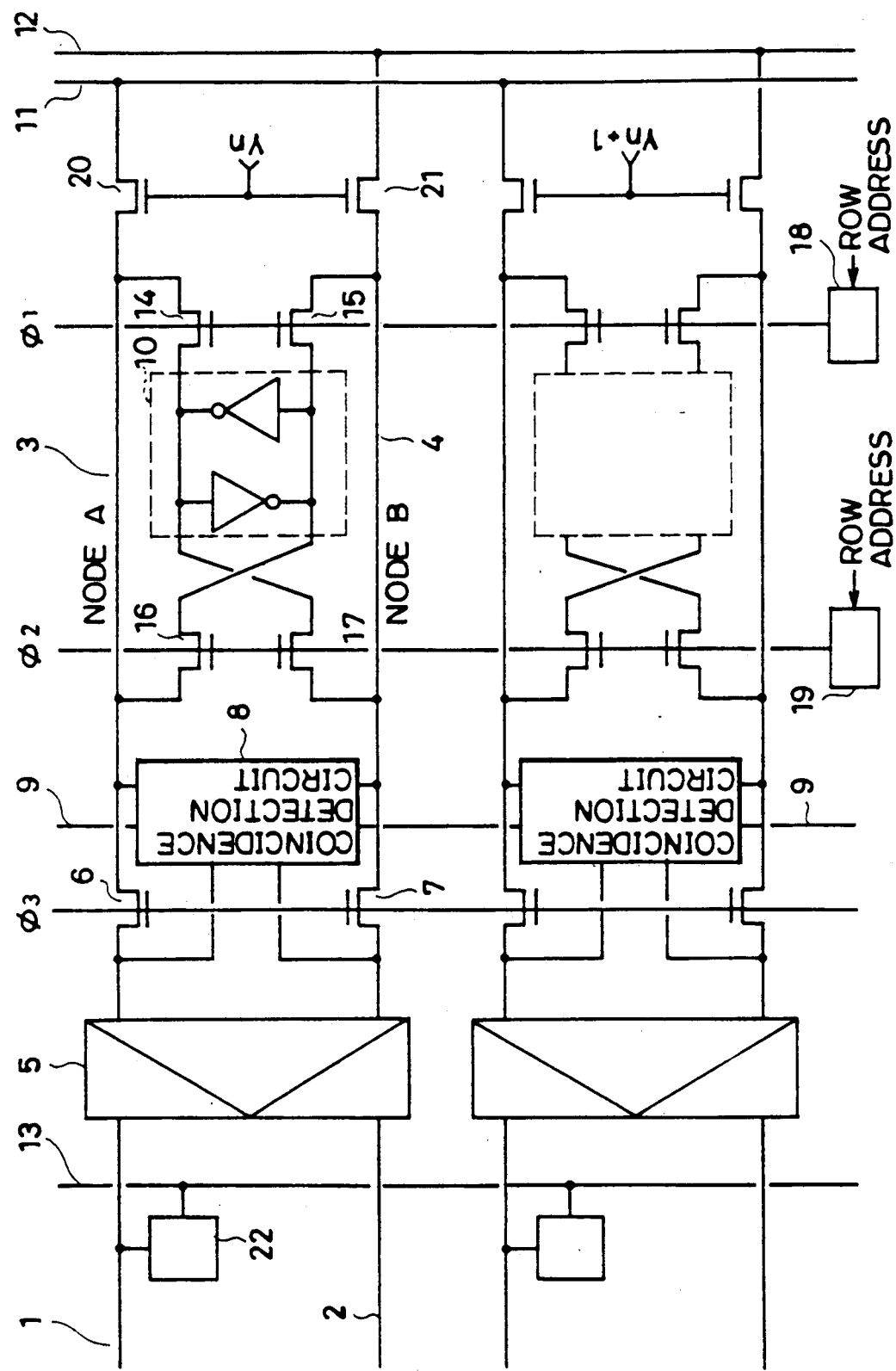
FIG. 1 is a block diagram of one embodiment of the present invention.
Figure 14:
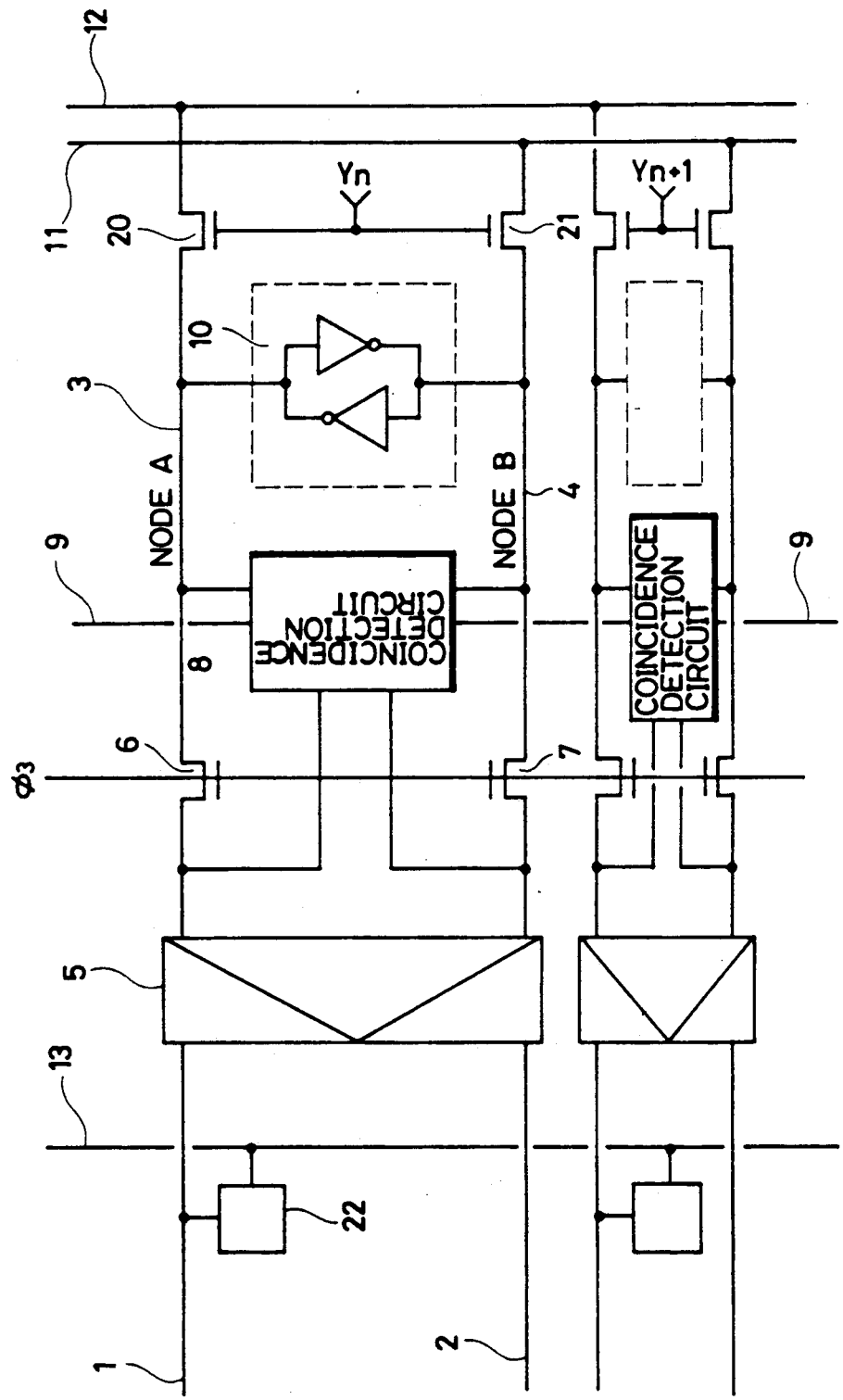
FIG. 14 is a diagram showing a part of an array structure of a conventional dynamic RAM self-containing a line mode test circuit.
Figure 15:
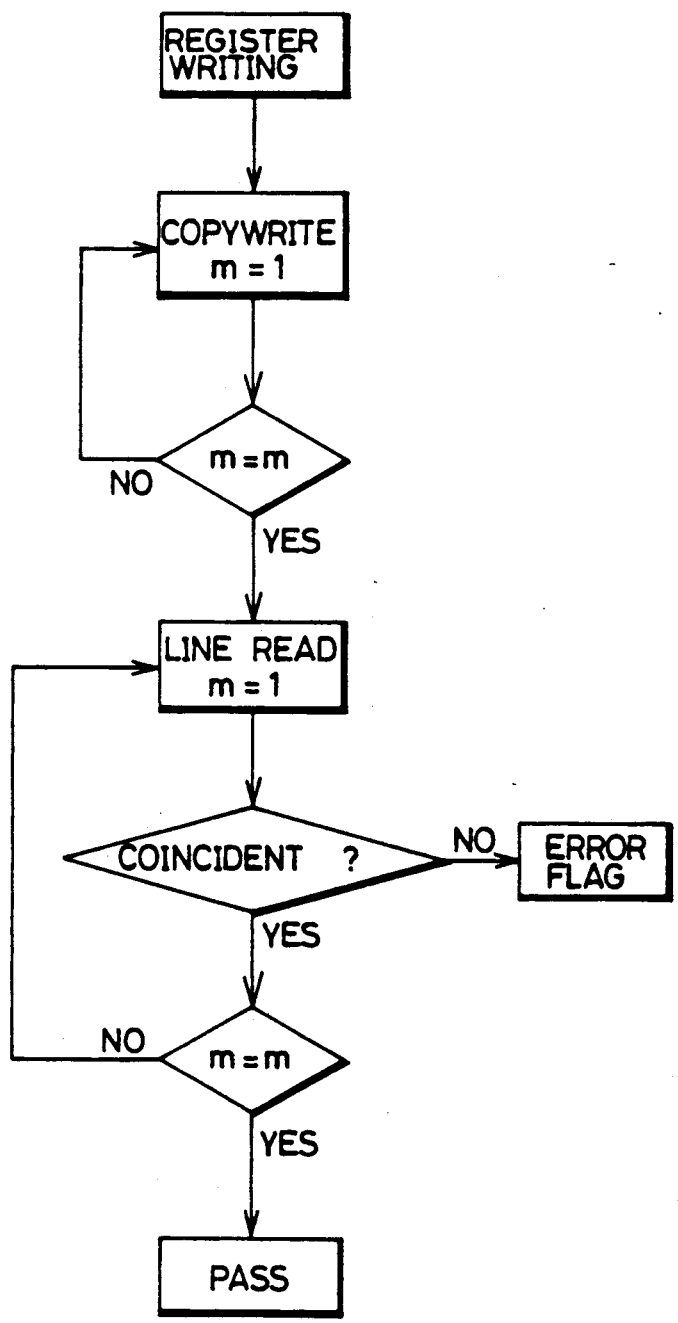
FIG. 15 is a flow chart explaining an operation for performing a line mode test in a conventional dynamic RAM shown in FIG. 14.
Figure 16:
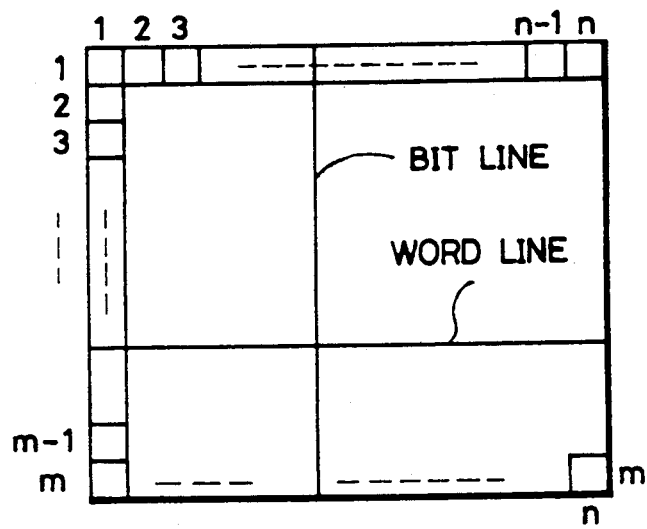
FIG. 16 is a diagram showing a memory array of a matrix of m rows by n columns.
Figure 17:
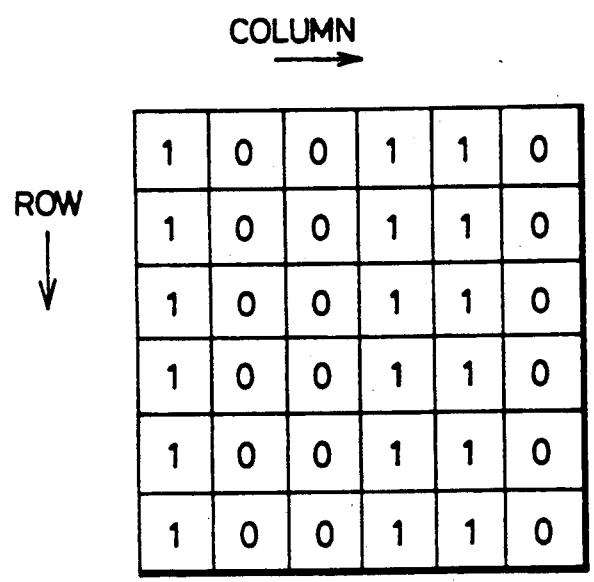
FIG. 17 is a diagram showing one example of test patterns in a line mode test in a conventional dynamic RAM.

FIG. 1 is a block diagram of one embodiment of the present invention. Now referring to FIG. 1, description will be given of a structure of one embodiment of the present invention. FIG. 1 is the same as the above described FIG. 14 except the following. More specifically, the register 10 is connected through transfer transistors 14 and 15, and an invert output of the register 10 is connected through transfer transistors 16 and 17 to the nodes 3 and 4. The transfer transistors 14 and 15 are controlled by a clock signal $\phi_1$ outputted from a clock generator 18, and the transfer transistors 16 and 17 are controlled by a clock signal $\phi_2$ outputted from a clock generator 19.

Figure 2:
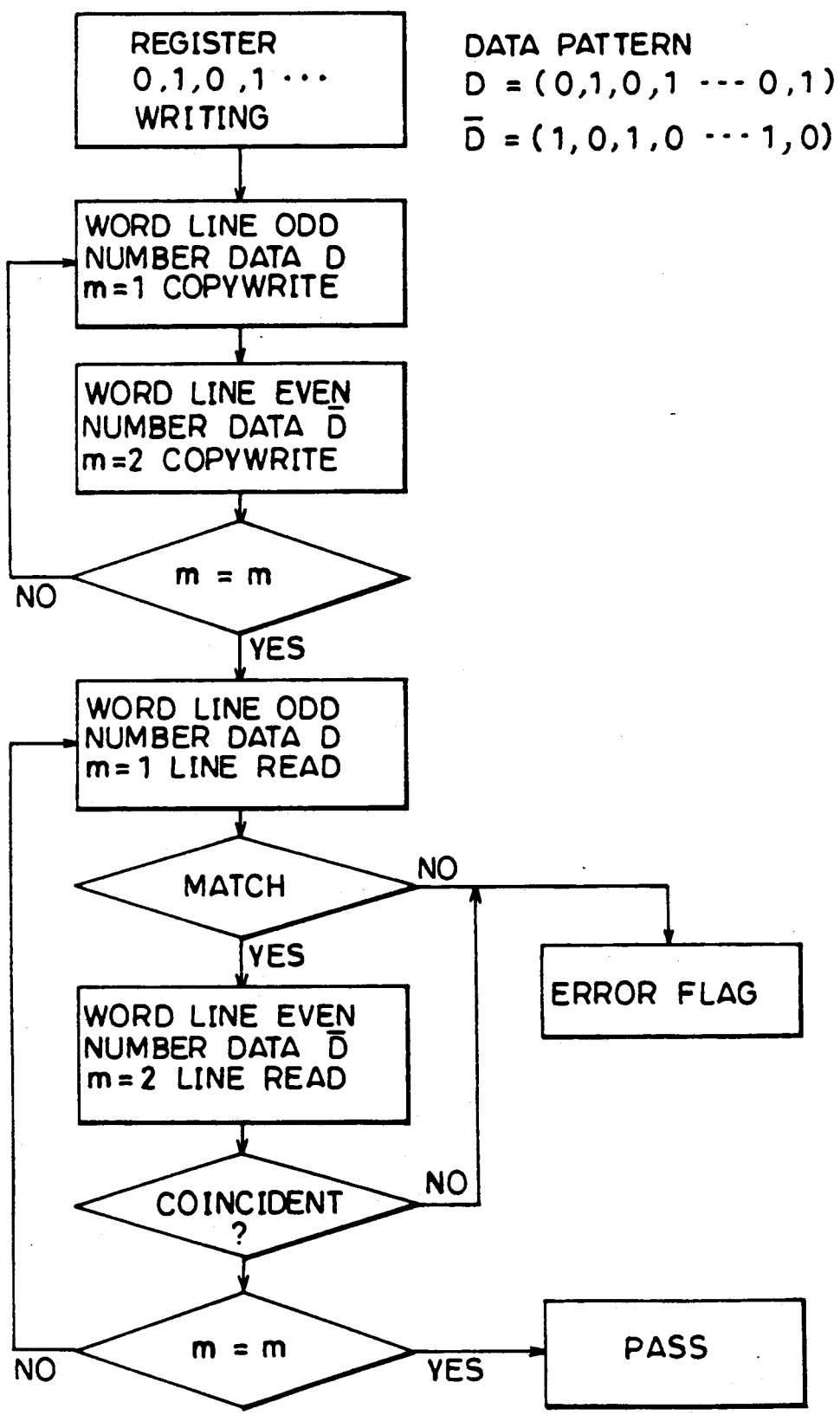
FIG. 2 is a flow chart for explaining an operation of one embodiment of the present invention.
Figures 3, 4:
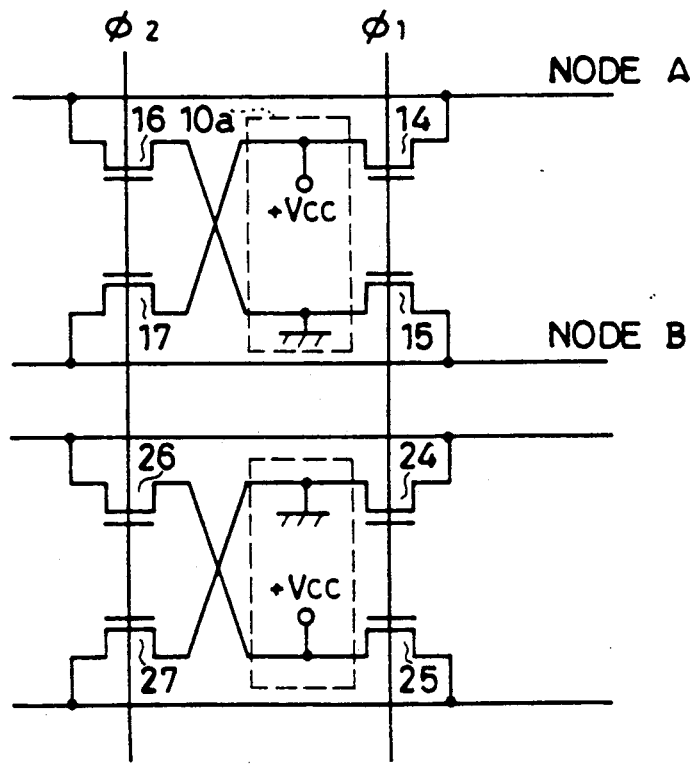
FIG. 3 is a diagram showing one example of test patterns according to the embodiment shown in FIG. 1.
FIG. 4 is an electric circuit diagram illustrating a test pattern generating portion in another embodiment of the present invention.

FIG. 2 is a flow chart for explaining an operation of one embodiment of the present invention, and FIG. 3 is a diagram showing one example of test patterns according to the embodiment shown in FIG. 1.

Now referring to FIGS. 1 to 3, description will be given of a line mode test of one embodiment of the present invention. First, the column decoder output signal Yn is applied to the transfer transistors 20 and 21, so that the transfer transistors 20 and 21 are rendered conductive. At the same time, the clock signal $\phi_1$ of the "H" level is applied to the transfer transistors 14 and 15 from the clock generator 18, so that the transfer transistors 14 and 15 are rendered conductive. At this time, the clock signal $\phi_2$ outputted from the clock generator 19 is at the "L" level and the transfer transistors 16 and 17 are non-conductive. A random test pattern column D is applied to a column of the register 10 from the I/O line pair of 11 and 12 through the transfer transistors 20 and 21, and 14 and 15, so that the random test pattern column D is written into the column of the register 10.

Then, the clock signal $\phi_3$ is applied to the transfer transistors 6 and 7, so that transfer transistors 6 and 7 are rendered conductive. Therefore, the test pattern column D written in the column of the register 10 is outputted from the transfer transistors 14 and 15 through the nodes 3 and 4 and the transfer transistors 6 and 7 to the bit line pair of 1 and 2, and the word line 13 is driven, whereby the random test pattern column D is written in a column of the memory cell 22. By the copy write operation, the random test pattern column D is written in the column of the memory cell 22 selected by the word line 13.

When, as shown in FIG. 3 (j), the above described transfer transistors 14 and 15 are rendered non-conductive, and the transfer transistors 16 and 17 are rendered conductive in response to the clock signal $\phi_2$, an invert data pattern $\overline{D}$ of the test pattern column D is transferred to a column of the memory cell to be written. When the memory cell array is structured by a matrix of m rows x n columns, n bit data is transferred each time, and by performing this operation n times, that is, to all the word lines, the data in the test pattern column can be written in a whole memory array in the same manner as the conventional example. Now, during a transfer of n times, by alternately rendering conductive the transfer transistors 14 and 15, and the transfer transistors 16 and 17 by the clock signals $\phi_1$ and $\phi_2$, the test pattern column D and the test pattern column $\overline{D}$ can be combined, so that a random test pattern column can be written in a bit line direction, which could not be achieved in the prior art.

Now a reading operation will be described. The data in the column of the memory cell 22 selected by the word line 13 is amplified by the sense amplifier 5 and read out onto the bit line pair of 1 and 2. At this time, a column of the data of the expectation is kept in a column of the register 10 and the transfer transistors 6 and 7 are non conductive. Then, it will be detected whether the data read from the memory cell 22 on the bit line pair of 1 and 2, and the data latched in the register 10 is coincident or not. At this time, it is controlled in response to the same word line address as that of a copy write operation whether the transfer transistors 14 and 15 are to be rendered conductive or the transfer transistors 16 and 17 are to be rendered conductive. The result is outputted onto the coincidence line 9 and if any of the data in the column of the memory cell 22 and the data in the column of the register 10 is incoincident, the level of the coincident line 9 is discharged to a lower level, so that an error flag is outputted as a test result.

A test time necessary for performing a test is completely the same as that of the prior art, which will be represented as $t = t_c (2m + n)$.

Now referring to the flow chart shown in FIG. 2, description will be given of a test operation by a check pattern shown in FIG. 3, which could not be performed in a line mode test of a conventional device. First, the data "0" and "1" are alternately written into a column of the register 10. Then, when the least significant bit of the address signal for selecting the word line 13 is "0", the clock signal $\phi_1$ is activated, so that the transfer transistors 14 and 15 are rendered conductive whereby the test pattern column D is transferred to a column of the memory cell 22. On the other hand, when the least significant bit of the address signal is "1", the clock signal $\phi_2$ is activated, so that the transfer transistors 16 and 17 are rendered conductive whereby an inverted transfer pattern column $\overline{D}$ is transferred from the register 10 to the memory cell 22, resulting in writing of a check pattern into the memory cell array.

On the other hand, during a reading operation, when the least significant bit of the address signal for selecting word line 13 is "0", the clock signal $\phi_1$ is activated, so that the transfer transistors 14 and 15 are rendered conductive and the transfer transistors 6 and 7 are non conductive. The coincidence detection circuit 8 detects whether the column D of the data of expectation and the memory cell column are coincident or not. In addition, when the least significant bit of the address signal is "1", the clock signal $\phi_2$ is activated, so that the transfer transistors 16 and 17 are rendered conductive, detecting whether an inverted column D of the data of expectation and the memory cell column are coincident or not. If there is an error, a flag is outputted.

FIG. 4 is an electric circuit diagram showing a test pattern generating portion in a further embodiment of the present invention. FIG. 5 is a diagram showing one example of test patterns generated according to the example shown in FIG. 4.

In the example shown in FIG. 4, the test pattern such as shown in FIG. 5 is produced in a simple structure in which a data generating means 10a is provided and a power supply voltage Vcc and a ground potential Vss are applied to the nodes 3 and 4 without provision of the register 10 shown in FIG. 1. More specifically, the power supply voltage +Vcc is applied to respective drains of transfer transistors 14 and 17, and drains of the transfer transistors 15 and 16 are grounded and provided with the ground potential Vss. Respective drains of transfer transistors 24, 27 in the adjacent columns are grounded, and the power supply voltage +Vcc are applied to respective drains of transfer transistors 25 and 26. Thus, by applying the power supply voltage Vcc and the ground potential Vss to the nodes 3 and 4, a stripe pattern in a row direction as shown in FIG. 5, and a random pattern as shown in FIG. 3 can be achieved.

In recent years, as reported in "ISSCC87 Digest of Technical Papers" pp. 286 by T. Osawa et al., an arrangement of a self test is proposed in which a memory chip itself has a function for generating a test pattern without using a tester. In the line mode test implemented in the present invention, such a self testing can also be performed, achieving a random test pattern. For example, in case of a check pattern, patterns of "0" and "1" can be easily inputted into a column of the register with a function of a column address. On the other hand, the patterns of "0" and "1" can be achieved in the bit line direction with a function of the low address. These patterns can be implemented with the counter and the address, so that it is easily known.

Such an embodiment will be described in the following.

Figure 6:
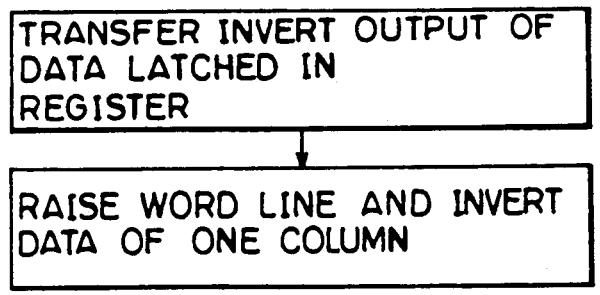
FIG. 6 is a flow chart for explaining an operation for storing inverted test data in memory cell column of the same word line, with the data left in a register.
Figure 7:
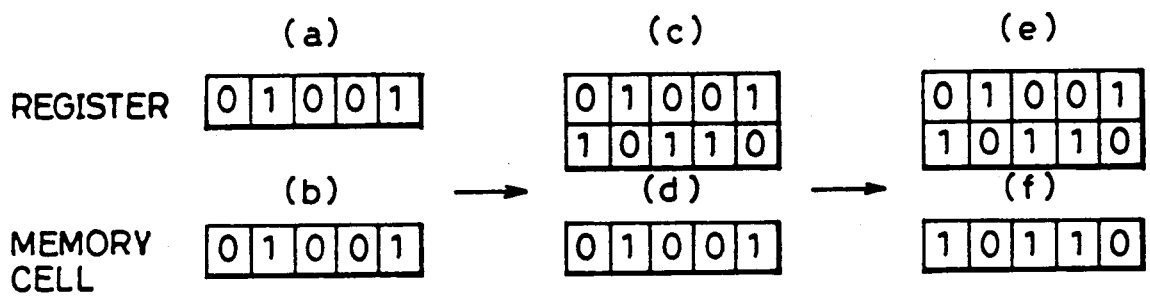
FIG. 7 is a diagram showing a change of the data.

FIG. 6 is a flow chart for explaining a testing operation for inverting data in a memory cell column of the same word line and writing the inverted data in the memory cell column, and FIG. 7 is a diagram showing the change of the data.

Now it is assumed that in a column of the registers 10 showing FIG. 1, for example, such test data "01001" as shown in FIG. 7(a) is left, and such initial data "01001" as shown in FIG. 7(b) is stored in a column of the memory cells 22 to which the word line 13 is connected. When the transfer transistors 16 and 17 are rendered conductive in response to the clock signal $\phi_2$, the data "01001" stored in the column of the registers 10 is inverted as shown in FIG. 7(c) and the inverted data "10110" is transferred to the column of the memory cells 22 as shown in FIG. 7(e). On this occasion, when the word line 13 is raised, the data "10110" is written in the column of the memory cells 22, as shown in FIG. 7(f).

Figure 8:
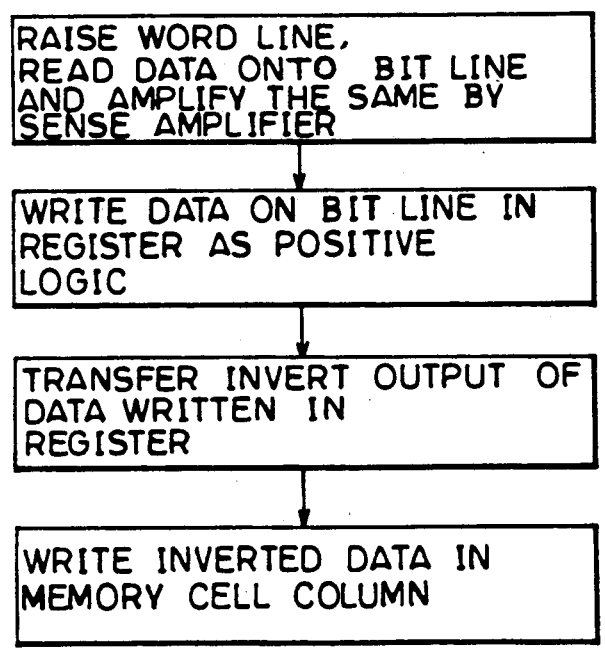
FIG. 8 is a flow chart for explaining an operation for inverting and storing data which is read from a memory cell column in a memory cell column of the same word line, with no data left in a register.

FIG. 8 is a flow chart for explaining a testing operation for reading and inverting data in a memory cell column of the same word line, and writing the inverted data in the same memory cell column, and FIG. 9 is a diagram showing the change of the data.

First, when the word line 13 is raised, the data "01001" stored in the column of the memory cells 22, as shown in FIG. 9(b), is read onto the bit line pair 1 and 2 and amplified by the sense amplifier 5. Then, the transfer transistors 14 and 15 are rendered conductive in response to the clock signal $\phi_1$, so that the data "01001" amplified by the sense amplifier 5 is stored in the register 10 through the transfer transistors 14 and 15, as shown in FIG. 9(a). When the transfer transistors 16 and 17 are rendered conductive in response to the clock signal $\phi_2$, the data "01001" stored in the column of the registers 10 is inverted and then, the inverted data "10110" as shown in FIG. 9(g) is outputted onto the bit line pair 1 and 2 through the transfer transistors 6 and 7. On this occasion, when the word line 13 is raised, the inverted data "100110" as shown in FIG. 9(j) is written in the column of the memory cells 22.

FIG. 10 is a flow chart for explaining a testing operation for inverting data in a memory cell column corresponding to a word line and writing the inverted data in memory cell column corresponding to another word line.

In this embodiment, the m-th address word line is raised, so that data stored in the corresponding memory cells is read out onto the bit line pair 1 and 2 and amplified by the sense amplifier 5. When the transfer transistors 14 and 15 are rendered conductive, the data amplified in the sense amplifier is stored in the column of the registers 10. Then, when the transistors 16 and 17 are rendered conductive, an invert output of the data written in the column of the registers 10 is transferred to the bit line pair 1 and 2. When the n-th address word line is raised, the inverted data is written in the corresponding memory cell column.

FIG. 11 is a flow chart for explaining a testing operation for inverting data in a memory cell column corresponding to a word line and writing the inverted data in a memory cell column corresponding to another word line, with the data left in the registers. In this embodiment, since the data is left in the register 10, when the transistors 16 and 17 are rendered conductive, an invert output of the data in the one column of the m-th address word line stored in the register 10 is transferred to the bit line pair 1 and 2. Then, when the n-th word line is raised, the inverted data is stored in the corresponding memory cell column.

Figure 12:
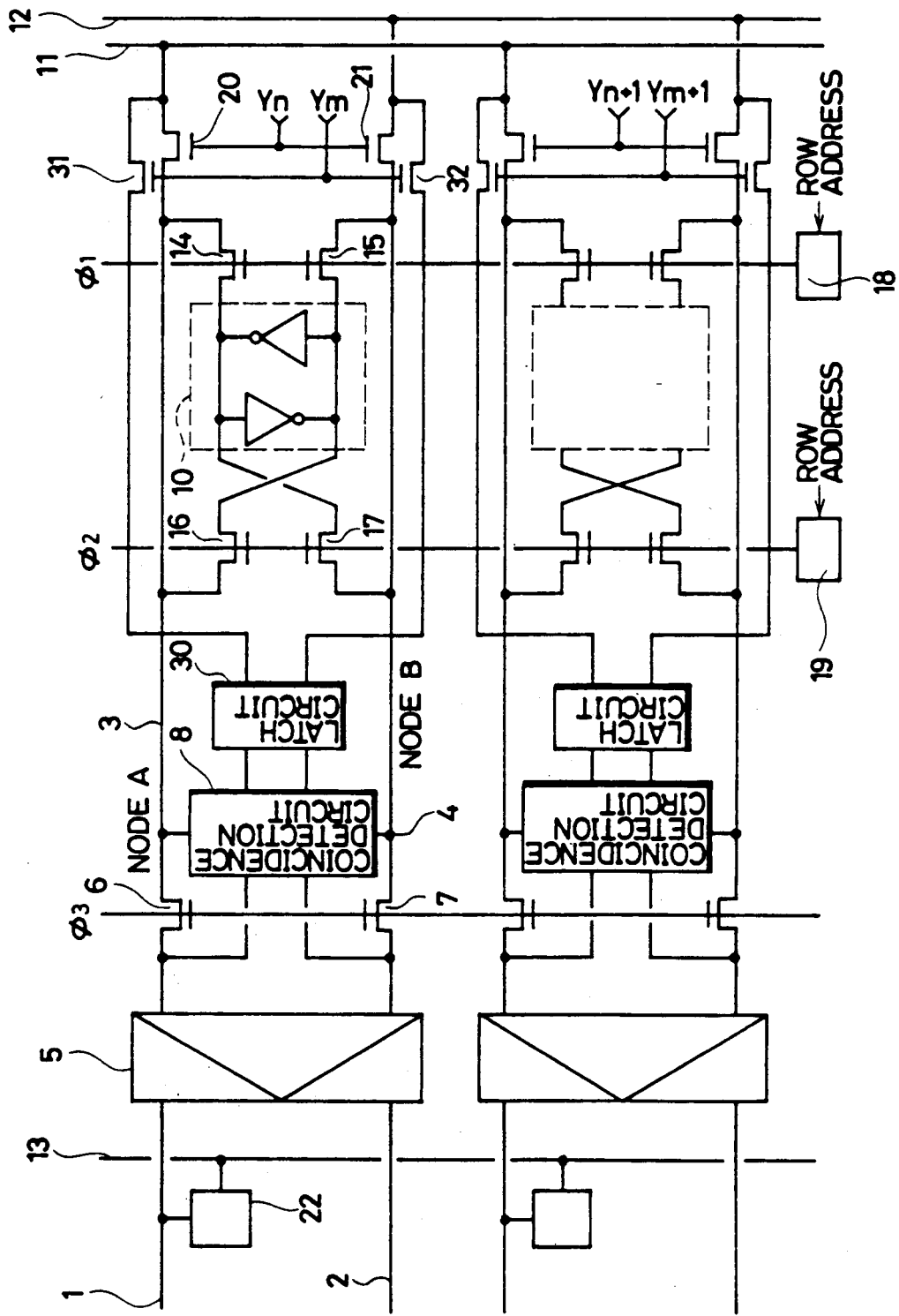
FIG. 12 is a diagram showing a further embodiment of the present invention.
Figure 13:
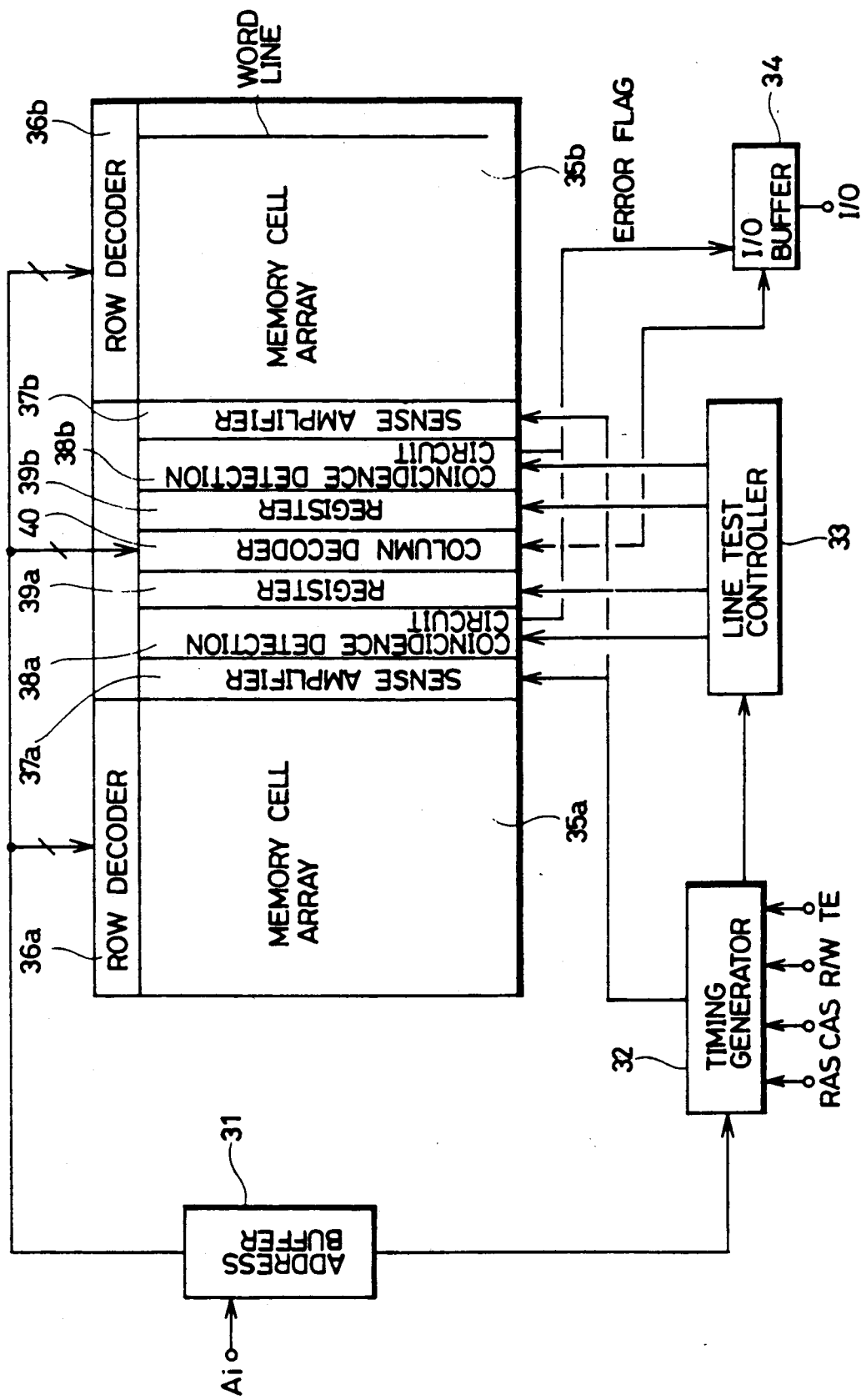
FIG. 13 is a block diagram showing an entire structure of a conventional dynamic RAM.

FIG. 12 is a diagram for showing a further embodiment of the present invention.

In the above described embodiment shown in FIG. 1, since a coincidence detection output of the coincidence detection circuit 8 is outputted for every word line, it is necessary to externally write and read test data in and from each memory cell again such that the read out data is compared with an expectation value by a test device externally connected to a memory, in order to detect a column address of an erroneous memory cell.

Therefore, the embodiment shown in FIG. 12 is structured such that a column address of an erroneous memory cell can be detected. More specifically, a latch circuit 30 is provided for latching the output of the coincidence detection circuit 8 and an output of the latch circuit 30 is connected to an I/O line pair 11 and 12 through transfer transistors 31 and 32. Gates of the transfer transistors 31 and 32 are connected together and a column decoder output signal Ym is supplied thereto.

The coincidence detection circuit 8 detects whether the test data stored in the register 10 and the data read out from the memory cell 22 are coincident or not to cause the latch circuit 30 to latch coincident or incoincident output. When the transfer transistors 31 and 32 are rendered conductive by the column decoder output signal Ym, the output of the latch circuit 30 is supplied to the I/O line pair 11 and 12. Accordingly, the column address corresponding to the erroneous memory cell can be easily outputted to the I/O line pair 11 and 12.

As described in the foregoing, according to the embodiments of the present invention, since it is structured such that data of first and second voltages respectively corresponding to first and second logic levels, or the data of the inversion of the first and second voltages, or the data of combination thereof can be written or read, a line mode test can be achieved which allows a random pattern also in the bit line direction, so that the test time can be drastically reduced, thereby significantly improving a sensitivity for detecting defect in the line mode test.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A test signal generator for a semiconductor integrated circuit memory having a plurality of bit line pairs, each pair including a first bit line (3) and a second bit line (4), comprising:
    a signal source (10) for outputting first and second voltages respectively corresponding to first and second logic levels,
    first switching means (14, 15) for selecting said first and second voltages outputted from said signal source and supplying the same to said first and second bit lines, and
    second switching means (16, 17) for selecting and inverting said first and second voltages outputted from said signal source and supplying the same to said first and second bit lines.

2. A test signal generator for a semiconductor integrated circuit memory according to claim 1, further comprising:
    a transfer gate (6, 9) for dividing each bit line of said plurality of bit line pairs (1, 2, 3, 4) into first and second nodes to connect memory cells (22) of said semiconductor integrated circuit memory to said first and second nodes, and wherein
    said signal source comprises register means for storing non-inverted and inverted logic level signals to the first nodes of said bit line pairs,
    said first switching means is connected so as to supply said non-inverted and inverted logic level signals stored in said register means to the respective first nodes of any of said bit line pairs,
    said second switching means is connected to supply said non-inverted and inverted logic level signals stored in said register means to the respective first nodes of any of said bit line pairs.

3. A test signal generator for a semiconductor integrated circuit memory according to claim 2, further comprising comparing means (8) for comparing the non-inverted and inverted logic level signal appearing on the first nodes of said bit line pairs with logic level signals appearing on the second nodes of said bit line pair,
    wherein said second switching means is connected between said comparing means and first nodes corresponding to bit lines of any of the bit line pairs corresponding to the non-inverted or inverted logic level signal stored in said register means.

4. A test signal generator for a semiconductor integrated circuit memory according to claim 3, further comprising:
    temporarily storing means (30) for temporarily storing a comparison output of said comparing means, and
    third switching means (31, 32) for outputting the comparison output temporarily stored in said temporarily storing means to said bit line pairs.

5. A test signal generator for a semiconductor integrated circuit memory having a bit line pair including first and second bit lines, a sense amplifier (5) connected to said bit line pair, a memory cell (22) connected to said bit line pair and a test circuit (8, 30) for testing a function of said memory cell, comprising:
    a signal source (10) for outputting first and second voltages respectively corresponding to first and second logic levels,
    first switching means (14, 15) for selecting said first and second voltages outputted from said signal source and supplying the same to said first and second bit lines, and
    second switching means (16, 17) for selecting and inverting said first and second voltages outputted from said signal source and supplying the same to said first and second bit lines.

6. A testing method for testing a column of memory cells of a semiconductor integrated circuit memory by a test circuit contained therein, comprising the steps of:
    a first step for establishing at least either non-inverted or inverted logic level signals of a plurality of bits corresponding to the column of said semiconductor integrated circuit memory,
    a second step for temporarily storing at least either said established non-inverted or inverted logic level signals of the plurality of bits,
    a third step for reading the logic level signals stored in said second step,
    a fourth step for inverting the logic level signals read out in said third step,
    a fifth step for transferring said inverted logic level signals to said memory cell and storing the same,
    a sixth step for reading the logic level signals stored in said fifth step, and
    a seventh step for comparing the logic level signals read out in said sixth step with the logic level signals temporarily stored in said second step.

7. A testing method for a semiconductor integrated circuit memory according to claim 6, further comprising a eighth step for temporarily storing the comparison result in said seventh step.

* * * * *